(12) United States Patent
Wu et al.

(10) Patent No.: US 10,992,289 B2
(45) Date of Patent: Apr. 27, 2021

(54) DYNAMIC FLIP FLOP AND ELECTRONIC DEVICE

(71) Applicant: DIGWISE TECHNOLOGY CORPORATION, LTD, Hsinchu County (TW)

(72) Inventors: Jingjie Wu, Beijing (CN); Chih-Wen Yang, Hsinchu County (TW); Wen-Pin Hsieh, Hsinchu County (TW)

(73) Assignee: DIGWISE TECHNOLOGY CORPORATION, LTD, Zhubei (TW)

( * ) Notice: Subject to any disclaimer, the term of this patent is extended or adjusted under 35 U.S.C. 154(b) by 0 days.

(21) Appl. No.: 16/622,952

(22) PCT Filed: Jun. 25, 2018

(86) PCT No.: PCT/CN2018/092538
§ 371 (c)(1),
(2) Date: Dec. 16, 2019

(87) PCT Pub. No.: WO2020/000120
PCT Pub. Date: Jan. 2, 2020

(65) Prior Publication Data
US 2021/0058073 A1 Feb. 25, 2021

(51) Int. Cl.
*H03K 3/037* (2006.01)
*H03K 19/094* (2006.01)

(52) U.S. Cl.
CPC ........... *H03K 3/037* (2013.01); *H03K 3/0372* (2013.01); *H03K 19/094* (2013.01)

(58) Field of Classification Search
CPC .... H03K 3/037; H03K 19/094; H03K 3/0372; H03K 3/0375; H03K 19/0941; H03K 19/0944; H03K 19/0948
See application file for complete search history.

(56) References Cited

U.S. PATENT DOCUMENTS 5,280,198 A * 1/1994 Almulla ............... H03K 5/2481
327/142
6,563,356 B2 * 5/2003 Fulkerson ............. H03K 3/012
327/203

* cited by examiner

*Primary Examiner* — Jung Kim

(57) ABSTRACT

A dynamic flip flop is provided. The dynamic flip-flop comprises a transmission gate, a first inverter, a second inverter, a pull-up transistor and a pull-down transistor. The pull-up transistor and the pull-down transistor constitute a feedback inverter, and the feedback inverter is configured as a weak keeper circuit compared to the first inverter serving as a tri-state inverter. Therefore, the dynamic flip-flop can be such that makes a master latch to use the tri-state inverter for capturing data in order to reduce electric leakage. In addition, the dynamic flip-flop can also be such that makes a slave latch to use the weak keeper circuit for storing data, thereby avoiding floating point to drive the output.

16 Claims, 8 Drawing Sheets

DYNAMIC FLIP FLOP AND ELECTRONIC DEVICE

FIELD OF THE INVENTION

The present invention relates to a flip flop (FF), and more particularly to a dynamic flip flop and an electronic device.

BACKGROUND OF THE INVENTION

In general, dynamic flip-flop can achieve logical function with fewer number of transistors. Therefore, compared to static flip flop, dynamic flip-flop has a small circuit layout area and thereby reducing the production cost. For example, please refer to FIG. 1, FIG. 1 is a schematic circuit diagram of a conventional dynamic flip-flop. A dynamic flip-flop 1 comprises a transmission gate 101, an inverter 102, a transmission gate 103 and an inverter 104. Firstly, the transmission gate 101 is used to receive a data signal D, and output the data signal D to the inverter 102 according to a clock signal CLKB and its inverted clock signal CP. The inverter 102 is used to invert the data signal D and output the inverted data signal D.

Next, the transmission gate 103 is used to receive the inverted data signal D, and output the inverted data signal D to the inverter 104 according to the clock signal CP and the clock signal CLKB. The inverter 104 is used to invert the inverted data signal D and output a data signal Q. It can be known from the above content that the dynamic flip-flop 1 under this type of architecture is more suitable for high-speed operation environment because the input signal load is reduced, but the disadvantages are that there will be problems of glitch and leakage currents, so that the erroneous data signal Q is output, or even a storage loss occurs. Therefore, there is a need to design a dynamic flip-flop that can solve the above-mentioned conventional problems while maintaining the advantages of the original area efficiency.

SUMMARY OF THE INVENTION

Embodiments of the present invention provide a dynamic flip-flop. The dynamic flip-flop has an input end and an output end, and comprises a transmission gate, a first inverter, a second inverter, a pull-up transistor and a pull-down transistor. The transmission gate is coupled to the input end and used to receive a first data signal, and output the first data signal to a first node according to a first clock signal and an inverted second clock signal thereof. The first inverter is coupled to the transmission gate via the first node, and is used to invert the first data signal and output the inverted first data signal to a second node. The second inverter is coupled between the second node and the output end, and is used to invert the inverted first data signal in order to generate a second data signal, and output the second data signal to the output end. The pull-up transistor is coupled between the second node and a power supply voltage, and is used to pull up the voltage of the second node to the power supply voltage. The pull-down transistor is coupled between the second node and a ground voltage, and is used to pull down the voltage of the second node to the ground voltage.

The structural features and the technical means adopted by the present invention to achieve the above and other objects can be best understood by referring to the following detailed description of the preferred embodiments and the accompanying drawings. However, the detailed description and the accompanying drawings are only used to explain and illustrate the present invention rather than as limitative of the appended claims of the present invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Hereinafter, the present invention will be described in detail with drawings illustrating various embodiments of the present invention. However, the concept of the present invention may be embodied in many different forms and should not be construed as limitative of the exemplary embodiments set forth herein. In addition, the same reference number in the figures can be used to represent the similar elements.

Figure 2:
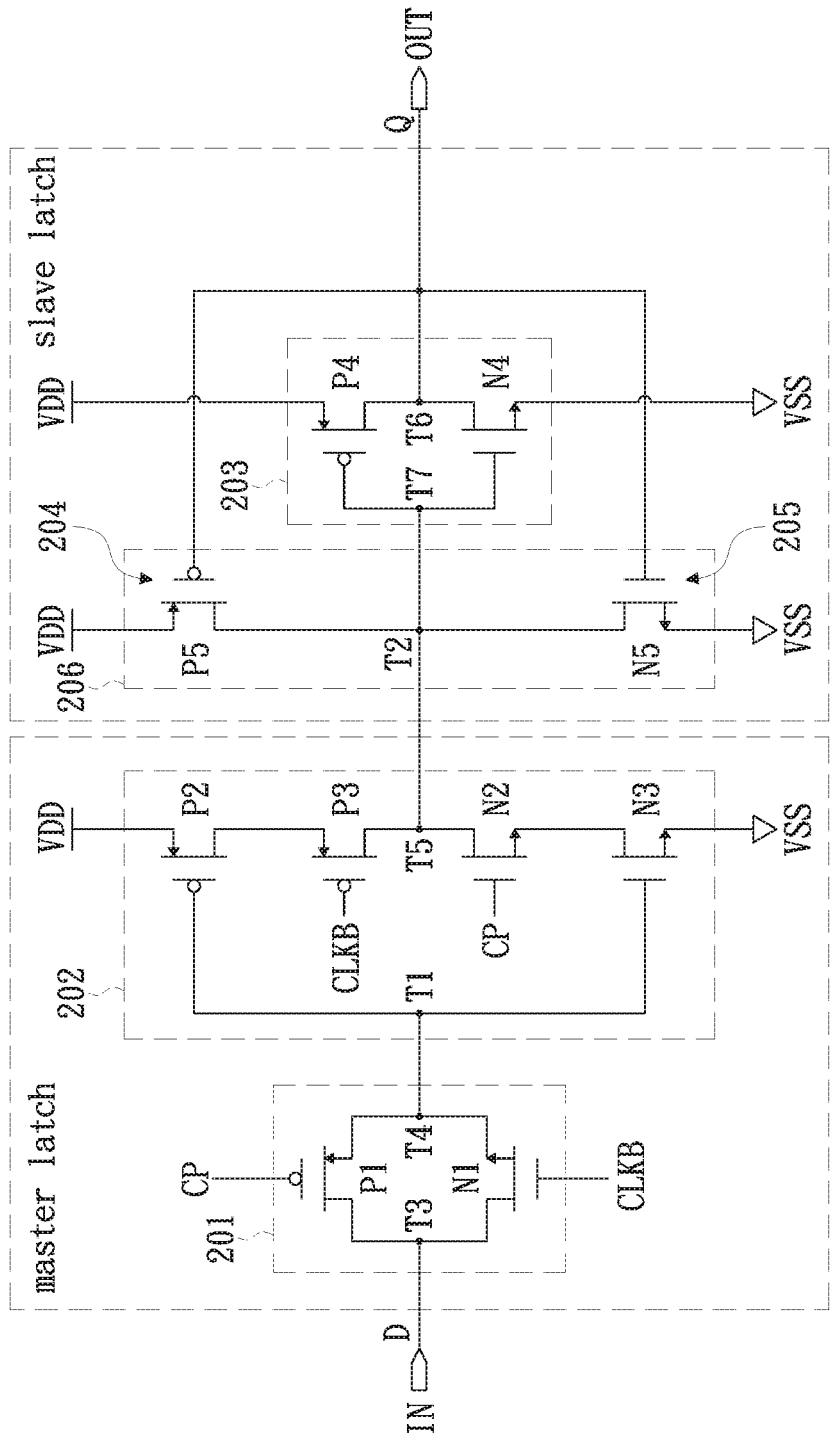
FIG. 2 is a schematic circuit diagram of a dynamic flip-flop provided by an embodiment of the present invention.

In detail, a dynamic flip-flop provided by an embodiment of the present invention can be applicable to any electronic device having a computing function, such as a smart phone, a game machine, a router, or a tablet, etc. In brief, the present invention does not limit the specific implementation manner of the dynamic flip-flop of the present embodiment included in the electronic device, and those ordinarily skilled in the art should be able to make relevant designs based on actual needs or applications. Please refer to FIG. 2. FIG. 2 is a schematic circuit diagram of a dynamic flip-flop provided by an embodiment of the present invention. A dynamic flip-flop 2 mainly has an input end IN and an output end OUT, and comprises a transmission gate 201, an inverter 202, an inverter 203, a pull-up transistor 204 and a pull-down transistor 205. In this embodiment, the transmission gate 201 is coupled to the input end IN, and is used to receive a data signal D, and output the data signal D to a node T1 according to a clock signal CLKB and an inverted clock signal CP thereof. The inverter 202 is coupled to the transmission gate 201 via the node T1, and is used to invert the data signal D and output the inverted data signal D to a node T2. It can be understood that the "node T1" of the present embodiment can only refer to the node where the transmission gate 201 is connected to the inverter 202, and the "node T2", i.e. refers to the node where the inverter 202 is connected to the inverter 203.

In addition, the inverter 202 is a first inverter, and the inverter 203 is a second inverter. In this embodiment, the inverter 203 is coupled between the node T2 and the output end OUT, and is used to invert the inverted data signal D in order to generate a data signal Q, and output the data signal Q to the output end OUT. The pull-up transistor 204 is coupled between the node T2 and a power supply voltage VDD, and is used to pull up the voltage of the node T2 to the power supply voltage VDD, and latch the data signal Q. The pull-down transistor 205 is coupled between the node T2 and a ground voltage VSS, and is used to pull down the voltage of the node T2 to the ground voltage VSS, and latch the data signal Q. Based on the teachings of the above, it should be understood by those having ordinary skill in the art that the dynamic flip-flop 2 provided by the embodiment of the present invention adopts a circuit design architecture completely different from the conventional dynamic flip-flop 1.

It should be understood that the so-called "clock signal CLKB" refers to the clock signal generated by the inversion of the original clock signal CLK (not drawn), and the so-called "clock signal CP" refers to the clock signal generated by the re-inversion of the clock signal CLKB. In summary, the "clock signal CP" is equivalent to the original clock signal CLK. However, the present invention does not limit the specific implementation manner of the clock signal CLKB and the clock signal CP. Those ordinarily skilled in the art should be able to make related designs according to actual needs or applications. However, since the principles of the clock signal CLKB and the clock signal CP used by the dynamic flip-flop 2 are well known to those having ordinary skill in the art, the details of the above-mentioned clock signal CLKB and the clock signal CP will not be further described herein.

Specifically, as shown in FIG. 2, the transmission gate 201 comprises an N-type metal-oxide-semiconductor field-effect transistor (NMOSFET) N1 and a P-type metal-oxide-semiconductor field-effect transistor (PMOSFET) P1 connected in parallel with each other, but the present invention is not limited by this connection relationship and transistor types. In this embodiment, the drain of the N-type MOS field-effect transistor N1 and the drain of the P-type MOS field-effect transistor P1 are commonly coupled to the input end IN of the dynamic flip-flop 2 via a node T3. The source of the N-type MOS field-effect transistor N1 and the source of the P-type MOS field-effect transistor P1 are commonly coupled to the node T1 via a node T4. The gate of the N-type MOS field-effect transistor N1 is used to receive the clock signal CLKB, and the gate of the P-type MOS field-effect transistor P1 is used to receive the clock signal CP. It can be understood that the "node T3" of the present embodiment can only refer to the node where the drain of the N-type MOS field-effect transistor N1 is connected to the drain of the P-type MOS field-effect transistor P1, and the "node T4", i.e. refers to the node where the source of the N-type MOS field-effect transistor N1 is connected to the source of the P-type MOS field-effect transistor P1.

In addition, the inverter 202 comprises two P-type MOS field-effect transistors P2 and P3 and two N-type MOS field-effect transistors N2 and N3 connected in series with each other. In this embodiment, the source of the P-type MOS field-effect transistor P2 is coupled to the power supply voltage VDD. The source of the N-type MOS field-effect transistor N3 is coupled to the ground voltage VSS. The gate of the P-type MOS field-effect transistor P2 and the gate of the N-type MOS field-effect transistor N3 are respectively coupled to the node T1 for receiving the data signal D. The source of the P-type MOS field-effect transistor P3 is coupled to the drain of the P-type MOS field-effect transistor P2. The source of the N-type MOS field-effect transistor N2 is coupled to the drain of the N-type MOS field-effect transistor N3. The drain of the P-type MOS field-effect transistor P3 and the drain of the N-type MOS field-effect transistor N2 are commonly coupled to the node T2 via a node T5. The gate of the P-type MOS field-effect transistor P3 is used to receive the clock signal CLKB, and the gate of the N-type MOS field-effect transistor N2 is used to receive the clock signal CP. It can be understood that the "node T5" of the present embodiment, i.e. refers to the node where the drain of the P-type MOS field-effect transistor P3 is connected to the drain of the N-type MOS field-effect transistor N2.

Figure 1:
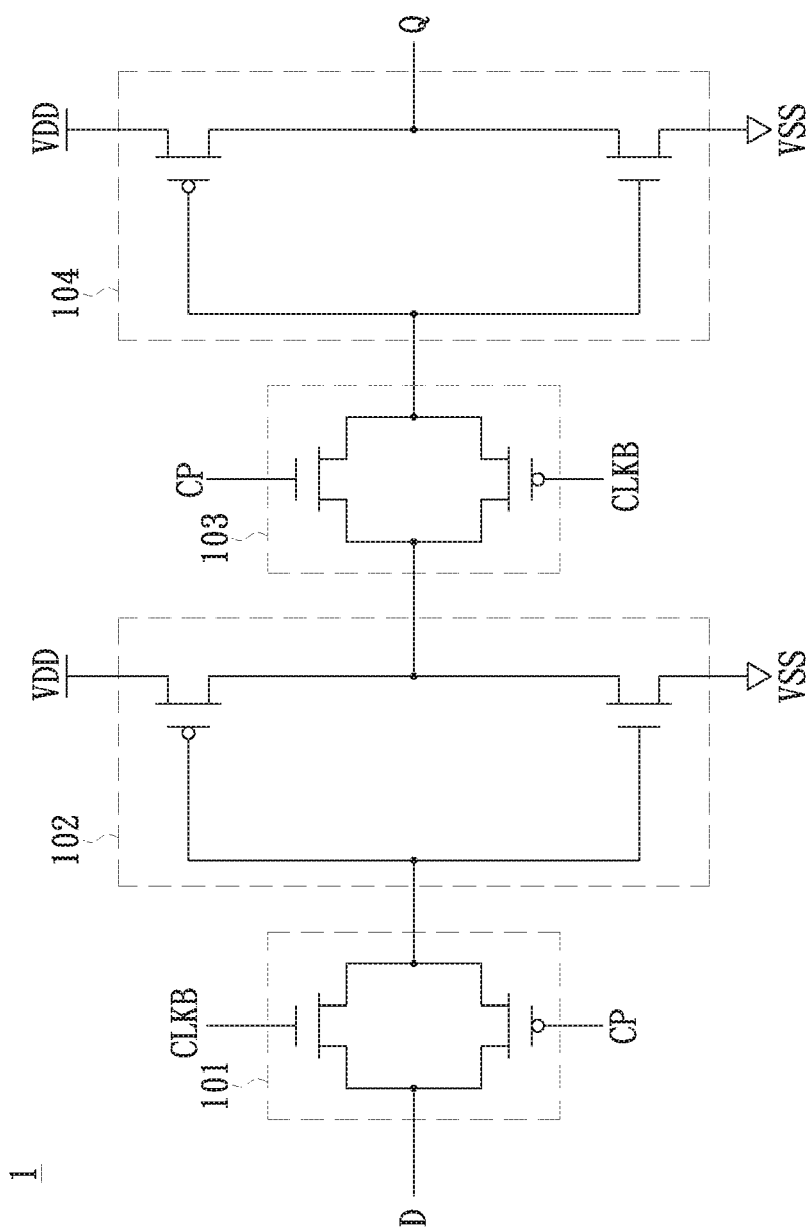
FIG. 1 is a schematic circuit diagram of a conventional dynamic flip-flop.

Therefore, compared with the inverter 102 of FIG. 1, the inverter 202 of FIG. 2 has added the circuit design of the P-type MOS field-effect transistor P3 and the N-type MOS field-effect transistor N2, and in this embodiment, the inverter 202 can be regarded as a tri-state inverter. In addition, the transmission gate 201 and the inverter 202 of FIG. 2 can also be viewed as a master latch as a whole. In light of the above teachings, those having ordinary skill in the art should be able to understand that a first primary spirit of the present invention is to make the master latch to utilize the tri-state inverter for data capturing in order to avoid attacks when the input end changes the state. In addition, the present invention can utilize this tri-state inverter to replace the output end serving as the master latch, thereby reducing leakage currents and remaining suitable for use in high speed operating environments.

For example, assuming under the condition that the inverter 202 does not have the P-type MOS field-effect transistor P3 and the N-type MOS field-effect transistor N2, the inverter 202 is likely to have leakage currents from between the power supply voltage VDD and the ground voltage VSS so that the node T2 is subjected to a leakage attack. Therefore, in this embodiment, the P-type MOS field-effect transistor P3 and the N-type MOS field-effect transistor N2 controlled by the clock signal CLKB and the clock signal CP are added to turn on or off the current path between the power supply voltage VDD and the ground voltage VSS in the inverter 202, thereby reducing the node T2 from being subjected to the leakage attack.

Figure 3:
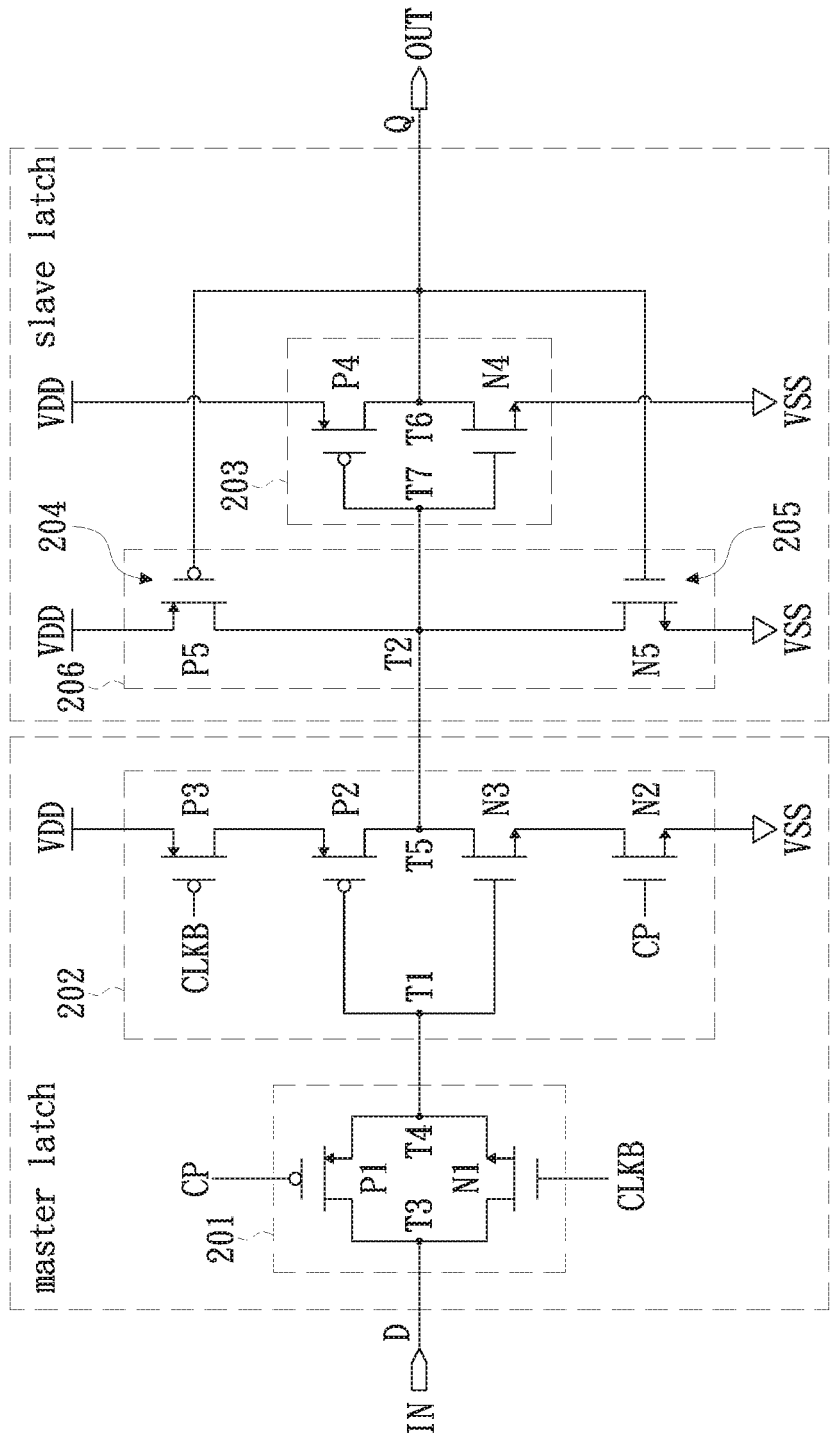
FIG. 3 is a schematic circuit diagram of a dynamic flip-flop provided by another embodiment of the present invention.

It is worth mentioning that under such a circuit design architecture, this master latch is correspondingly an edge triggered latch. However, since the operational principles of the P-type MOS field-effect transistors P1, P2, P3 and the N-type MOS field-effect transistors N1, N2, and N3 are well known to those of ordinarily skilled in the art, the details of the above-mentioned master latch, that is, the transmission gate 201 and the inverter 202, will not be further described herein. It should be explained that the specific implementation manner of the inverter 202 in FIG. 2 is merely an example herein, and is not intended to limit the present invention. For example, please refer to FIG. 3. FIG. 3 is a schematic circuit diagram of a dynamic flip-flop provided by another embodiment of the present invention. Wherein, the partial components in FIG. 3 that are the same as or similar to those in FIG. 2 are denoted by the same or similar reference numerals, and thus the details thereof will not be further described herein again.

In other embodiments, as shown in FIG. 3, the P-type MOS field-effect transistor P3 can be changed to be coupled close to the power supply voltage VDD, and the N-type MOS field-effect transistor N2 can be changed to be coupled close to the ground voltage VSS. In other words, in the embodiment of FIG. 3, the source of the P-type MOS field-effect transistor P3 is coupled to the power supply voltage VDD, and the source of the N-type MOS field-effect transistor N2 is coupled to the ground voltage VSS. The drain of P-type MOS field-effect transistor P3 is coupled to the source of P-type MOS field-effect transistor P2. The drain of the N-type MOS field-effect transistor N2 is coupled to the source of the N-type MOS field-effect transistor N3. The drain of the P-type MOS field-effect transistor P2 and the drain of the N-type MOS field-effect transistor N3 are commonly coupled to the node T2 via the node T5. It can be understood that the "node T5" of the embodiment of FIG. 3, i.e. is changed to refer to the node where the drain of the P-type MOS field-effect transistor P2 is connected to the drain of the N-type MOS field-effect transistor N3. In brief, the present invention does not limit the specific implementation manner of the inverter 202, those ordinarily skilled in the art should be able to make related designs according to actual needs or applications.

In addition, referring back to FIG. 2, the inverter 203 comprises a P-type MOS field-effect transistor P4 and an N-type MOS field-effect transistor N4 connected in series with each other, but the present invention is not limited by this connection relationship and the transistor types. In this embodiment, the source of the P-type MOS field-effect transistor P4 is coupled to the power supply voltage VDD, and the source of the N-type MOS field-effect transistor N4 is coupled to the ground voltage VSS. The drain of the P-type MOS field-effect transistor P4 and the drain of the N-type MOS field-effect transistor N4 are commonly coupled to the output end OUT via a node T6. The gate of the P-type MOS field-effect transistor P4 and the gate of the N-type MOS field-effect transistor N4 are commonly coupled to the node T2 via a node T7 for receiving the inverted data signal D. It can be understood that the "node T6" of the present embodiment can only refer to the node where the drain of the P-type MOS field-effect transistor P4 is connected to the drain of the N-type MOS field-effect transistor N4, and the "node T7", i.e. refers to the node where the gate of the P-type MOS field-effect transistor P4 is connected to the gate of the N-type MOS field-effect transistor N4. Since the operational principles of the inverter 203 are also well known to those having ordinary skill in the art, the details of the above-described inverter 203 will not be further described herein.

On the other hand, as shown in FIG. 2, the pull-up transistor 204 can be a P-type MOS field-effect transistor P5, and the pull-down transistor 205 can be an N-type MOS field-effect transistor N5, but the present invention is not limited by the transistor types. In this embodiment, the source of the P-type MOS field-effect transistor P5 is coupled to the power supply voltage VDD, and the source of the N-type MOS field-effect transistor N5 is coupled to the ground voltage VSS. The drain of the P-type MOS field-effect transistor P5 and the drain of the N-type MOS field-effect transistor N5 are respectively coupled to the node T2. The gate of the P-type MOS field-effect transistor P5 and the gate of the N-type MOS field-effect transistor N5 are respectively coupled to the output end OUT for receiving the data signal Q.

That is, in the present embodiment, the pull-up transistor 204 and the pull-down transistor 205 can constitute a feedback inverter 206. It can be understood that the feedback inverter 206 and the inverter 203 of FIG. 2 can further be regarded as a slave latch as a whole. And in this embodiment, compared to the inverter 202, this feedback inverter 206 must be configured as a weak keeper circuit. Specifically, when the next new batch of data is to be written, the inverter 202 and the inverter 206 may easily cause data collision on the node T2, thus the signal output capability of the inverter 202 must be greater than the signal output capability of the inverter 206, so that the data on the node T2 can be forced to be updated. Therefore, the inverter 206 must be configured as a weak keeper circuit as compared to the inverter 202.

In general, the strong keeper circuit and the weak keeper circuit are usually distinguished by designing different threshold voltages or channel lengths. Therefore, if the inverter 202 is a short channel device, the feedback inverter 206 of the present embodiment should be relatively designed as a long channel device; or if the inverter 202 is a low threshold voltage component, the feedback inverter 206 of this embodiment should be relatively designed as a high threshold voltage component. In summary, the present invention does not limit the specific implementation manner of the strong/weak keeper circuits, and those ordinarily skilled in the art should be able to make related designs according to actual needs or applications.

Obviously, in light of the above teachings, those of ordinarily skilled in the art should also understand that a second primary spirit of the present invention is to make the slave latch to use the weak keeper circuit to store data in order to avoid floating point to drive the output and ensure the slave latch can operate at low frequencies. In addition to this, the present invention will utilize this weak keeper circuit to maintain the state of the node T2. For example, if the voltage of the output end OUT is at a certain logic low level, the P-type MOS field-effect transistor P5 (i.e. the pull-up transistor 204) is turned on to pull the voltage of the node T2 up to the power supply voltage VDD.

Contrarily, if the voltage of the output end OUT is at a certain logic high level, the N-type MOS field-effect transistor N5 (i.e. the pull-down transistor 205) is turned on to pull the voltage of the node T2 down to the ground voltage VSS. However, since the operational principles of the P-type MOS field-effect transistors P4, P5 and the N-type MOS field-effect transistors N4, N5 are well known to those of ordinarily skilled in the art, the details of the above-described slave latches, i.e. the inverter 203, the pull-up transistor 204, and the pull-down transistor 205 will not be further described herein.

Figure 4:
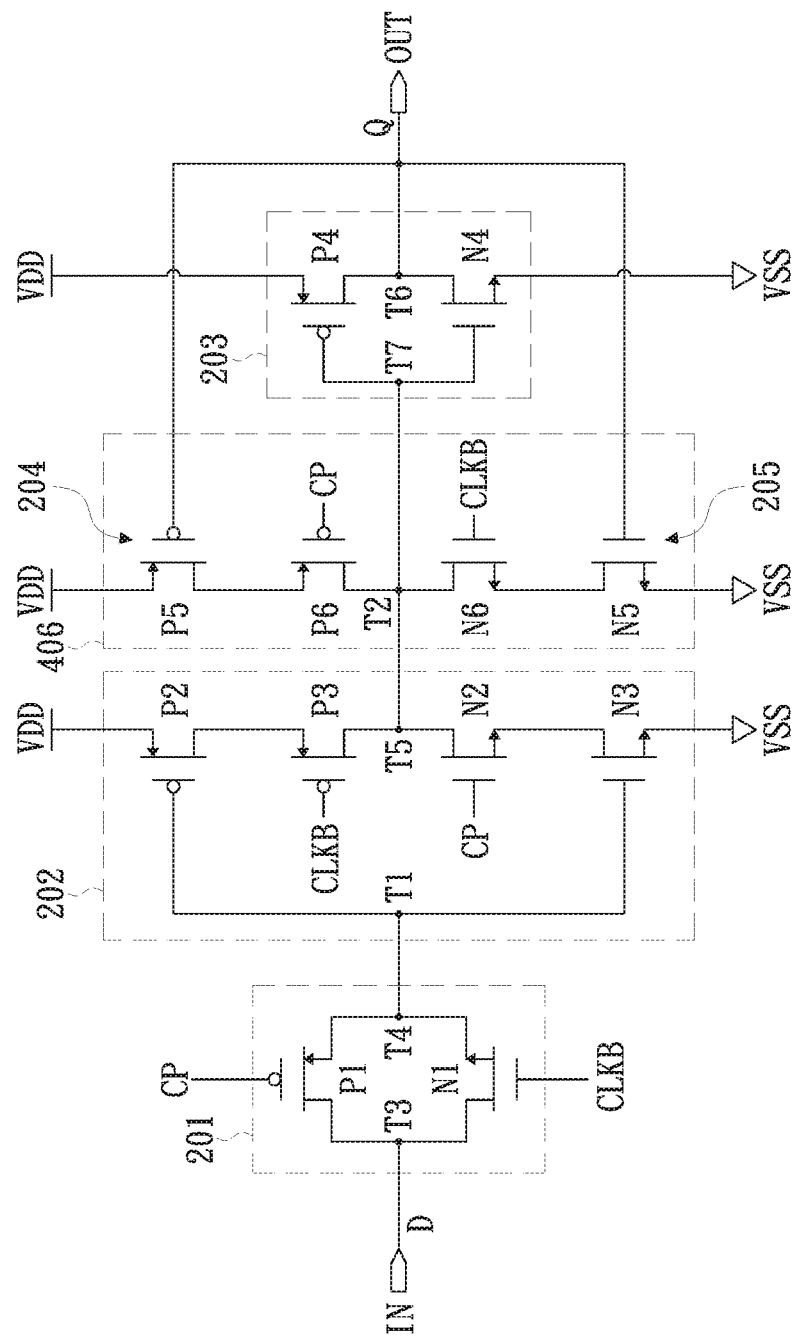
FIG. 4 is a schematic circuit diagram of a dynamic flip-flop provided by another embodiment of the present invention.

It should be explained that, if take into consideration the design concept of the strong keeper circuit is even more directly extended to the output end OUT, thus in other embodiments (not shown), the slave latch can also be that there is no need to use the feedback inverter 206, but instead utilizing the tri-state characteristics of the inverter 202, and integrating the inverter 203 to configure as a strong keeper circuit. This design approach can also contribute to maintaining the state of the node T2. Since the details are also the same as described in the foregoing embodiments, they will not be further described herein again. In addition, please refer to FIG. 4. FIG. 4 is a schematic circuit diagram of a dynamic flip-flop provided by another embodiment of the present invention. Wherein, the partial components in FIG. 4 that are the same as or similar to those in FIG. 2 are denoted by the same or similar reference numerals, and thus the details thereof will not be further described herein again.

Compared with the dynamic flip-flop 2 of FIG. 2, a dynamic flip-flop 4 of FIG. 4 further comprises a P-type MOS field-effect transistor P6 and an N-type MOS field-effect transistor N6 connected in series between the P-type MOS field-effect transistor P5 and the N-type MOS field-effect transistor N5. In this embodiment, the source of the P-type MOS field-effect transistor P6 is coupled to the drain of the P-type MOS field-effect transistor P5; the source of the N-type MOS field-effect transistor N6 is coupled to the drain of the N-type MOS field-effect transistor N5; and the drain of the P-type MOS field-effect transistor P6 and the drain of the N-type MOS field-effect transistor N6 are respectively coupled to the node T2. The gate of the P-type MOS field-effect transistor P6 is used to receive the clock signal CP, and the gate of the N-type MOS field-effect transistor N6 is used to receive the clock signal CLKB.

In other words, in the present embodiment, the P-type MOS field-effect transistors P5, P6 and the N-type MOS field-effect transistors N5, N6 can be regarded as a feedback latch 406 as a whole. Since the feedback latch 406 employs a design similar to that of the inverter 202, this embodiment will enable the layout architecture of the dynamic flip-flop 4 to be more friendly, thereby reducing process variations. In addition, in this embodiment, the P-type MOS field-effect transistor P6 and the N-type MOS field-effect transistor N6 in the feedback latch 406 are used to again prevent the node T2 from being subjected to leakage attacks. Since the details are also the same as described in the foregoing embodiments, they will not be further described herein again.

On the other hand, if take into consideration the dynamic flip-flop 2 of FIG. 2 can also have a hold time function, and without having to additionally increase the number of transistors, the present invention makes the transmission gate 201 to be configured as a weak keeper circuit, and the generation path of the clock signal should be configured as a strong keeper circuit as compared to the transmission gate 201. For example, the clock signal CLKB herein can only be referred to as being directly generated by the clock signal CP via another inverter (not shown), and the other inverter is configured to be a strong keeper circuit compared to the transmission gate 201. Since the operational principles of the strong keeper circuit and the weak keeper circuit are well known to those ordinarily skilled in the art, the details of the above content will not be further described herein.

Figure 5:
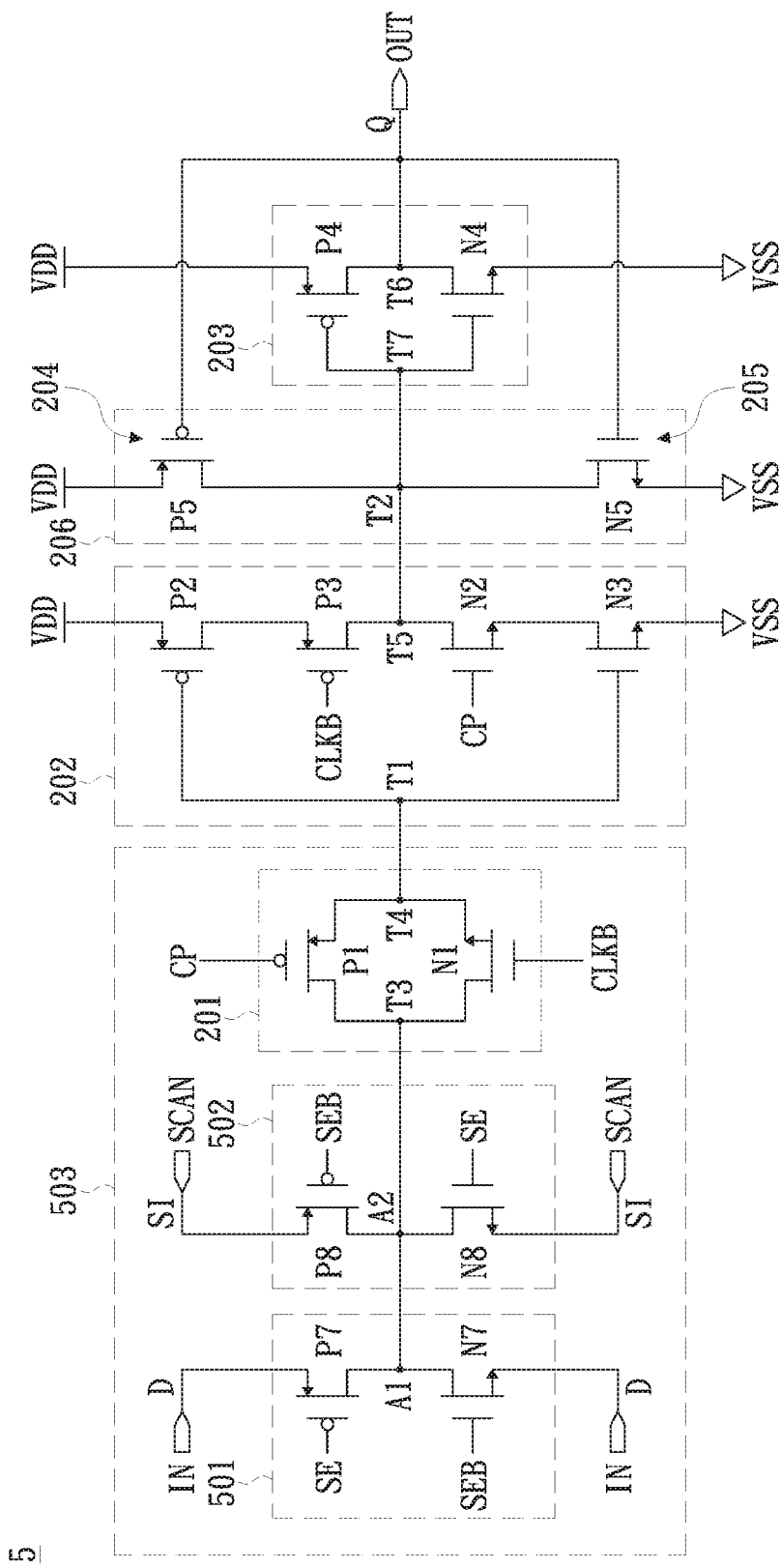
FIG. 5 is a schematic circuit diagram of a dynamic flip-flop provided by another embodiment of the present invention.

In addition, if take into consideration to make the dynamic flip-flop 2 more capable of having a scan function, thus please refer to FIG. 5 also. FIG. 5 is a schematic circuit diagram of a dynamic flip-flop provided by another embodiment of the present invention. Wherein, the partial components in FIG. 5 that are the same as or similar to those in FIG. 2 are denoted by the same or similar reference numerals, and thus the details thereof will not be further described herein again.

As shown in FIG. 5, a dynamic flip-flop 5 can further comprise a transistor string 501 and a transistor string 502 coupled between the input end IN and the node T3. In the present embodiment, the transistor string 501 comprises a P-type MOS field-effect transistor P7 and an N-type MOS field-effect transistor N7 connected in series with each other. Wherein, the source of the P-type MOS field-effect transistor P7 and the source of the N-type MOS field-effect transistor N7 are respectively coupled to the input end IN for receiving the data signal D; the drain of the P-type MOS field-effect transistor P7 and the drain of the N-type MOS field-effect transistor N7 are commonly coupled to the node T3 via a sub-node A1; the gate of the P-type MOS field-effect transistor P7 is used to receive a scan enable signal SE; and the gate of the N-type MOS field-effect transistor N7 is used to receive a scan enable signal SEB that is an inversion of the scan enable signal SE.

In addition, in the present embodiment, the transistor string 502 comprises a P-type MOS field-effect transistor P8 and an N-type MOS field-effect transistor N8 connected in series with each other. Wherein, the source of the P-type MOS field-effect transistor P8 and the source of the N-type MOS field-effect transistor N8 are respectively coupled to a scanning end SCAN for receiving a scan signal SI; the drain of the P-type MOS field-effect transistor P8 and the drain of the N-type MOS field-effect transistor N8 are commonly coupled to the node T3 via a sub-node A2; the gate of the P-type MOS field-effect transistor P8 is used to receive the scan enable signal SEB; and the gate of the N-type MOS field-effect transistor N8 is used to receive the scan enable signal SE. It can be understood that the "sub-node A1" and the "sub-node A2" in this embodiment can only refer to the same sub-node, and the sub-node, i.e. refers to the node where the input end IN is connected to the node T3.

That is, in the present embodiment, the transistor strings 501, 502 and the transmission gate 201 can be viewed as a data multiplexer (MUX) 503 as a whole, and it should be understood that this embodiment utilizes the transmission gate 201 to serve as a control end of the data multiplexer 503, so that the data multiplexer 503 can selectively outputting the data signal D or the scan signal SI to the inverter 202. In light of the above teachings, it should be understood by those ordinarily skilled in the art that the dynamic flip-flop 5 of FIG. 5 can have power consumption superior to that of the conventional dynamic flip-flop 1. Since the operational principles of the flip-flop having the scan function are also known to those of ordinary skill in the art, the details of the above-mentioned content will not be further described herein.

Figure 6:
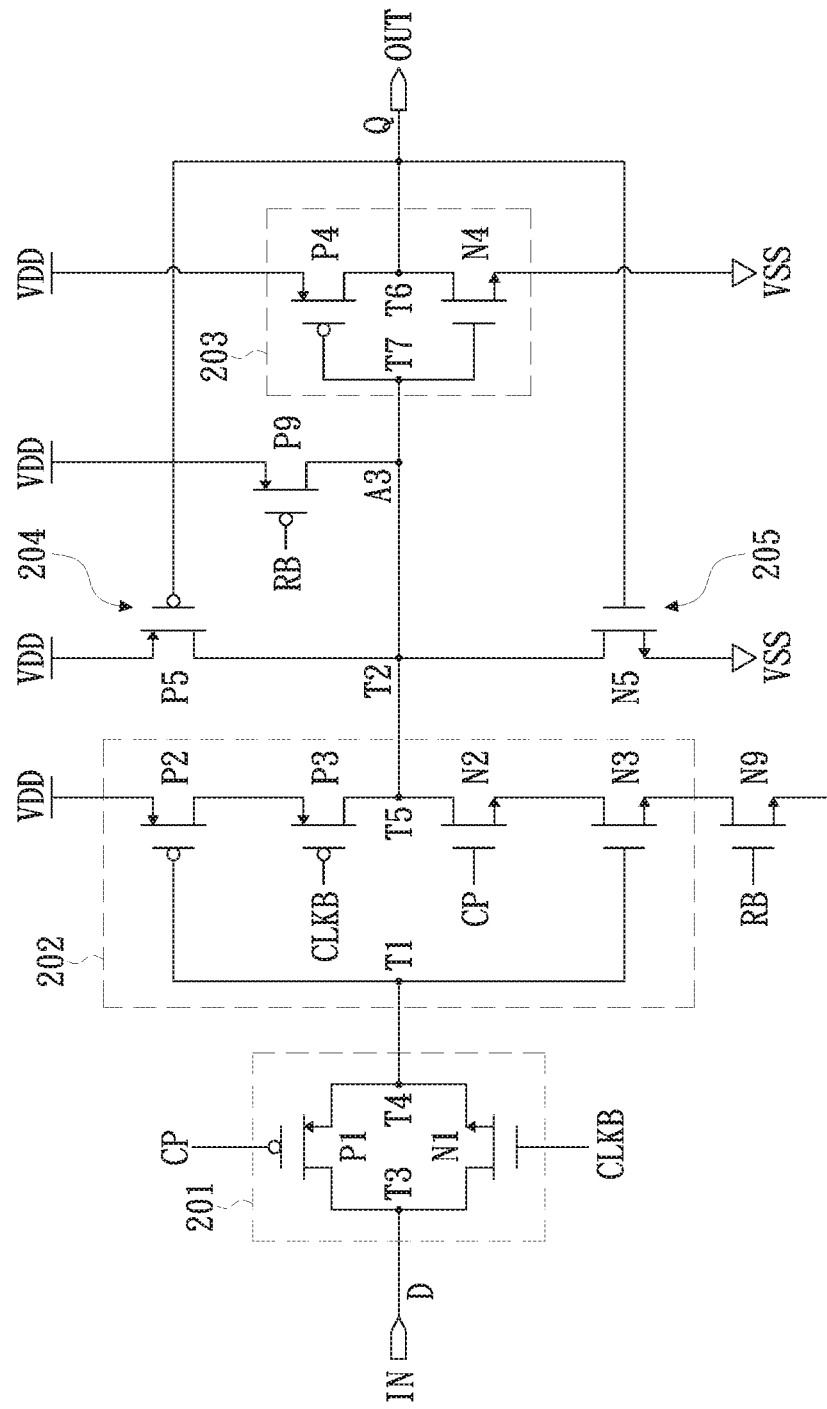
FIG. 6 is a schematic circuit diagram of a dynamic flip-flop provided by another embodiment of the present invention.

Or, if take into consideration to make the dynamic flip-flop 2 more capable of having a reset function, thus please refer to FIG. 6 also. FIG. 6 is a schematic circuit diagram of a dynamic flip-flop provided by another embodiment of the present invention. Wherein, the partial components in FIG. 6 that are the same as or similar to those in FIG. 2 are denoted by the same or similar reference numerals, and thus the details thereof will not be further described herein again. As shown in FIG. 6, a dynamic flip-flop 6 can further comprise a P-type MOS field effect transistor P9 and an N-type MOS field effect transistor N9. In this embodiment, the P-type MOS field-effect transistor P9 is coupled between the node T2 and the node T7. Wherein, the source of the P-type MOS field-effect transistor P9 is coupled to the power supply voltage VDD; the drain of the P-type MOS field-effect transistor P9 is coupled to a sub-node A3 between the node T2 and the node T7; and the gate of the P-type MOS field-effect transistor P9 is used to receive a reset signal RB.

In addition, in the present embodiment, the N-type MOS field-effect transistor N9 is connected in series between the N-type MOS field-effect transistor N3 and the ground voltage VSS. Wherein, the source of the N-type MOS field-effect transistor N9 is coupled to the ground voltage VSS; the drain of the N-type MOS field-effect transistor N9 is coupled to the source of the N-type MOS field-effect transistor N3; and the gate of the N-type MOS field-effect transistor N9 is used to receive the reset signal RB. That is, compared with the conventional dynamic flip-flop 1, the dynamic flip-flop 6 of FIG. 6 only needs to add a small number of transistors to achieve having the reset function, and the dynamic flip-flop 6 of FIG. 6 can still adopt a circuit design that solves the aforementioned leakage currents problem. Since the operational principles of the flip-flop having the reset function are also well known to those of ordinary skill in the art, the details of the above-mentioned content will not be further described herein.

Figure 7:
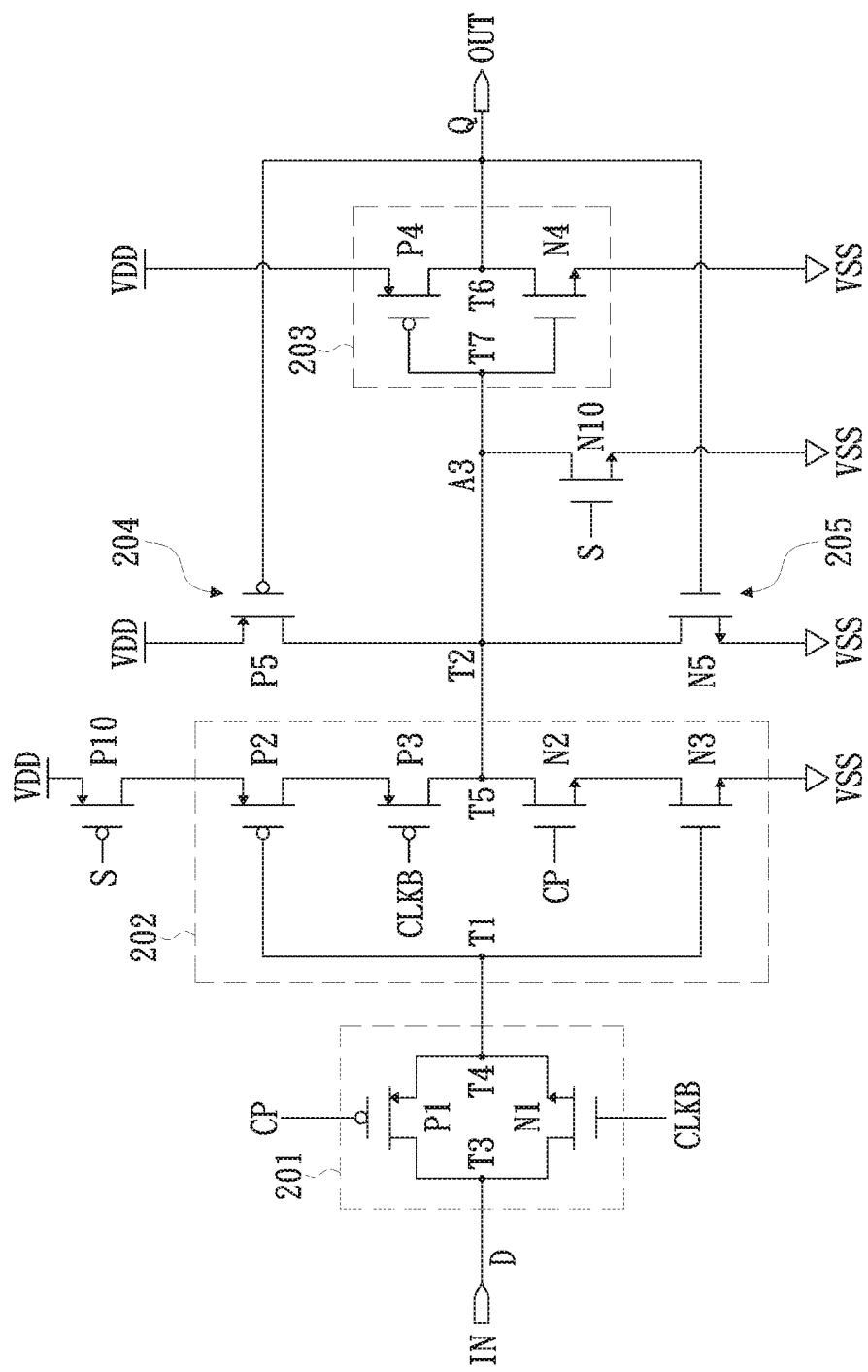
FIG. 7 is a schematic circuit diagram of a dynamic flip-flop provided by another embodiment of the present invention.

Similarly, if take into consideration to make the dynamic flip-flop 2 more capable of having a set function, thus please refer to FIG. 7 also. FIG. 7 is a schematic circuit diagram of a dynamic flip-flop provided by another embodiment of the present invention. Wherein, the partial components in FIG. 7 that are the same as or similar to those in FIG. 2 are denoted by the same or similar reference numerals, and thus the details thereof will not be further described herein again. As shown in FIG. 7, a dynamic flip-flop 7 can further comprise a P-type MOS field-effect transistor P10 and an N-type MOS field-effect transistor N10. In the present embodiment, the P-type MOS field-effect transistor P10 is connected in series between the power supply voltage VDD and the P-type MOS field-effect transistor P2. Wherein, the source of the P-type MOS field-effect transistor P10 is coupled to the power supply voltage VDD; the drain of the P-type MOS field-effect transistor P10 is coupled to the source of the P-type MOS field-effect transistor P2; and the gate of the P-type MOS field-effect transistor P10 is used to receive a set signal S.

In addition, in this embodiment, the N-type MOS field-effect transistor N10 is coupled between the node T2 and the node T7. Wherein, the source of the N-type MOS field-effect transistor N10 is coupled to the ground voltage VSS; the drain of the N-type MOS field-effect transistor N10 is coupled to the sub-node A3 between the node T2 and the node T7; and the gate of the N-type MOS field-effect transistor N10 is used to receive the set signal S. However, since the advantages of the dynamic flip-flop 7 and the operational principles of the flip-flop having the set function are also well known to those of ordinary skill in the art, the details of the above-mentioned content will not be further described herein.

Figure 8:
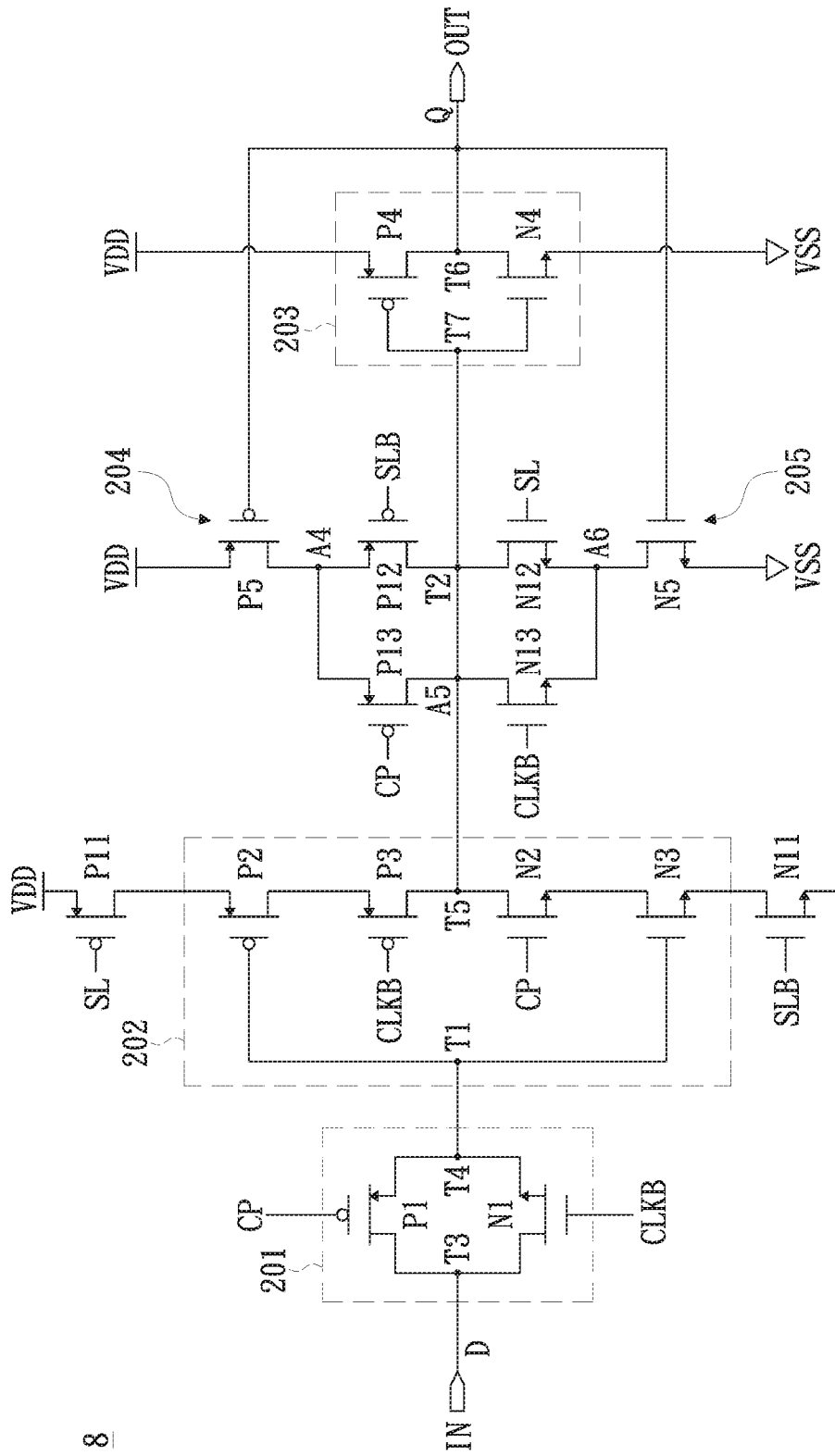
FIG. 8 is a schematic circuit diagram of a dynamic flip-flop provided by another embodiment of the present invention.

On the other hand, if take into consideration to make the dynamic flip-flop 2 more capable of having a data retention function, thus please refer to FIG. 8 also. FIG. 8 is a schematic circuit diagram of a dynamic flip-flop provided by another embodiment of the present invention. Wherein, the partial components in FIG. 8 that are the same as or similar to those in FIG. 2 are denoted by the same or similar reference numerals, thus the details thereof will not be further described herein again. As shown in FIG. 8, a dynamic flip-flop 8 can further comprise P-type MOS field-effect transistors P11, P12, P13 and N-type MOS field-effect transistors N11, N12, N13.

In the present embodiment, the P-type MOS field-effect transistor P11 is connected in series between the power supply voltage VDD and the P-type MOS field-effect transistor P2. Wherein, the source of the P-type MOS field-effect transistor P11 is coupled to the power supply voltage VDD; the drain of the P-type MOS field-effect transistor P11 is coupled to the source of the P-type MOS field-effect transistor P2; and the gate of the P-type MOS field-effect transistor P11 is used to receive a control signal SL. The N-type MOS field-effect transistor N11 is connected in series between the N-type MOS field-effect transistor N3 and the ground voltage VSS. Wherein, the source of the N-type MOS field-effect transistor N11 is coupled to the ground voltage VSS; the drain of the N-type MOS field-effect transistor N11 is coupled to the source of the N-type MOS field-effect transistor N3; and the gate of the N-type MOS field-effect transistor N11 is used to receive a control signal SLB that is an inversion of the control signal SL.

In addition, in the present embodiment, the P-type MOS field-effect transistor P12 is connected in series between the P-type MOS field-effect transistor P5 and the node T2. Wherein, the source of the P-type MOS field-effect transistor P12 is coupled to the drain of the P-type MOS field-effect transistor P5; the drain of the P-type MOS field-effect transistor P12 is coupled to the node T2; and the gate of the P-type MOS field-effect transistor P12 is used to receive the control signal SLB. The N-type MOS field-effect transistor N12 is connected in series between the N-type MOS field-effect transistor N5 and the node T2. Wherein, the source of the N-type MOS field-effect transistor N12 is coupled to the drain of the N-type MOS field-effect transistor N5; the drain of the N-type MOS field-effect transistor N12 is coupled to the node T2; and the gate of the N-type MOS field-effect transistor N12 is used to receive the control signal SL.

Similarly, in this embodiment, the source of the P-type MOS field-effect transistor P13 is coupled to a sub-node A4 between the drain of the P-type MOS field-effect transistor P5 and the source of the P-type MOS field-effect transistor P12; the drain of the P-type MOS field-effect transistor P13 is coupled to a sub-node A5 between the node T2 and the node T5; and the gate of the P-type MOS field-effect transistor P13 is used to receive the clock signal CP. In addition, the source of the N-type MOS field-effect transistor N13 is coupled to a sub-node A6 between the drain of the N-type MOS field-effect transistor N5 and the source of the N-type MOS field-effect transistor N12; the drain of the N-type MOS field-effect transistor N13 is coupled to the sub-node A5; and the gate of the N-type MOS field-effect transistor N13 is used to receive the clock signal CLKB. Since the operational principles of the flip-flop having the data retention are also well known to those of ordinary skill in the art, the details of the above-mentioned content will not be further described herein.

In summary, the dynamic flip-flop provided by the embodiments of the present invention adopts a circuit design architecture that is completely different from the conventional dynamic flip-flop. Specifically, the dynamic flip-flop of the embodiments can be such that makes the master latch to use the tri-state inverter to capture data in order to reduce leakage currents. In addition, the dynamic flip-flop of the embodiments can also be such that makes the slave latch to use a weak keeper circuit to store data in order to avoid floating point to drive the output.

Note that the specification relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A dynamic flip-flop, having an input end and an output end, and comprising:
   a transmission gate coupled to the input end and used to receive a first data signal, and output the first data signal to a first node according to a first clock signal and an inverted second clock signal thereof;
   a first inverter coupled to the transmission gate via the first node, and used to invert the first data signal and output the inverted first data signal to a second node;
   a second inverter coupled between the second node and the output end, and used to invert the inverted first data signal in order to generate a second data signal, and output the second data signal to the output end;
   a pull-up transistor coupled between the second node and a power supply voltage, and used to pull up a voltage of the second node to the power supply voltage; and a pull-down transistor coupled between the second node and a ground voltage, and used to pull down the voltage of the second node to the ground voltage;

wherein the transmission gate comprises a first N-type metal-oxide-semiconductor field-effect transistor and a first P-type metal-oxide-semiconductor field-effect transistor connected in parallel with each other, the drain of the first N-type MOS field-effect transistor and the drain of the first P-type MOS field-effect transistor are commonly coupled to the input end of the dynamic flip-flop via a third node, the source of the first N-type MOS field-effect transistor and the source of the first P-type MOS field-effect transistor are commonly coupled to the first node via a fourth node, the gate of the first N-type MOS field-effect transistor is used to receive the first clock signal, and the gate of the first P-type MOS field-effect transistor is used to receive the second clock signal;

wherein the first inverter is a tri-state inverter, and comprises a second P-type MOS field-effect transistor, a third P-type MOS field-effect transistor, a second N-type MOS field-effect transistor and a third N-type MOS field-effect transistor connected in series with each other, the source of the second P-type MOS field-effect transistor is coupled to the power supply voltage, the source of the third N-type MOS field-effect transistor is coupled to the ground voltage, the gate of the second P-type MOS field-effect transistor and the gate of the third N-type MOS field-effect transistor are respectively coupled to the first node for receiving the first data signal, the source of the third P-type MOS field-effect transistor is coupled to the drain of the second P-type MOS field-effect transistor, the source of the second N-type MOS field-effect transistor is coupled to the drain of the third N-type MOS field-effect transistor, the drain of the third P-type MOS field-effect transistor and the drain of the second N-type MOS field-effect transistor are commonly coupled to the second node via a fifth node, the gate of the third P-type MOS field-effect transistor is used to receive the first clock signal, and the gate of the second N-type MOS field-effect transistor is used to receive the second clock signal;

wherein the second inverter comprises a fourth P-type MOS field-effect transistor and a fourth N-type MOS field-effect transistor connected in series with each other, the source of the fourth P-type MOS field-effect transistor is coupled to the power supply voltage, the source of the fourth N-type MOS field-effect transistor is coupled to the ground voltage, the drain of the fourth P-type MOS field-effect transistor and the drain of the fourth N-type MOS field-effect transistor are commonly coupled to the output end of the dynamic flip-flop via a sixth node, and the gate of the fourth P-type MOS field-effect transistor and the gate of the fourth N-type MOS field-effect transistor are commonly coupled to the second node via a seventh node for receiving the inverted first data signal;

wherein the pull-up transistor is a fifth P-type MOS field-effect transistor, the pull-down transistor is a fifth N-type MOS field-effect transistor, the source of the fifth P-type MOS field-effect transistor is coupled to the power supply voltage, the source of the fifth N-type MOS field-effect transistor is coupled to the ground voltage, the drain of the fifth P-type MOS field-effect transistor and the drain of the fifth N-type MOS field-effect transistor are respectively coupled to the second node, and the gate of the fifth P-type MOS field-effect transistor and the gate of the fifth N-type MOS field-effect transistor are respectively coupled to the output end of the dynamic flip-flop for receiving the second data signal;

wherein the pull-up transistor and the pull-down transistor constitute a feedback inverter, and the feedback inverter is configured as a weak keeper circuit compared to the first inverter.

2. The dynamic flip-flop as claimed in claim 1, further comprising a sixth P-type MOS field-effect transistor and a sixth N-type MOS field-effect transistor connected in series between the fifth P-type MOS field-effect transistor and the fifth N-type MOS field-effect transistor, the source of the sixth P-type MOS field-effect transistor is coupled to the drain of the fifth P-type MOS field-effect transistor, the source of the sixth N-type MOS field-effect transistor is coupled to the drain of the fifth N-type MOS field-effect transistor, the drain of the sixth P-type MOS field-effect transistor and the drain of the sixth N-type MOS field-effect transistor are respectively coupled to the second node, the gate of the sixth P-type MOS field-effect transistor is used to receive the second clock signal, and the gate of the sixth N-type MOS field-effect transistor is used to receive the first clock signal.

3. The dynamic flip-flop as claimed in claim 1, further comprising a first transistor string and a second transistor string coupled between the input end and the third node.

4. The dynamic flip-flop as claimed in claim 3, wherein the first transistor string comprises a seventh P-type MOS field-effect transistor and a seventh N-type MOS field-effect transistor connected in series with each other, the source of the seventh P-type MOS field-effect transistor and the source of the seventh N-type MOS field-effect transistor are respectively coupled to the input end for receiving the first data signal, the drain of the seventh P-type MOS field-effect transistor and the drain of the seventh N-type MOS field-effect transistor are commonly coupled to the third node via a first sub-node, the gate of the seventh P-type MOS field-effect transistor is used to receive a first scan enable signal, and the gate of the seventh N-type MOS field-effect transistor is used to receive a second scan enable signal that is an inversion of the first scan enable signal.

5. The dynamic flip-flop as claimed in claim 4, wherein the second transistor string comprises an eighth P-type MOS field-effect transistor and an eighth N-type MOS field-effect transistor connected in series with each other, the source of the eighth P-type MOS field-effect transistor and the source of the eighth N-type MOS field-effect transistor are respectively coupled to a scanning end for receiving a scan signal, the drain of the eighth P-type MOS field-effect transistor and the drain of the eighth N-type MOS field-effect transistor are commonly coupled to the third node via a second sub-node, the gate of the eighth P-type MOS field-effect transistor is used to receive the second scan enable signal, and the gate of the eighth N-type MOS field-effect transistor is used to receive the first scan enable signal.

6. The dynamic flip-flop as claimed in claim 1, further comprising:
a ninth P-type MOS field effect transistor coupled between the second node and the seventh node, wherein the source of the ninth P-type MOS field-effect transistor is coupled to the power supply voltage, the drain of the ninth P-type MOS field-effect transistor is coupled to a third sub-node between the second node and the seventh node, the gate of the ninth P-type MOS field-effect transistor is used to receive a reset signal; and a ninth N-type MOS field-effect transistor connected in series between the third N-type MOS field-effect transistor and the ground voltage, wherein the source of the ninth N-type MOS field-effect transistor is coupled to the ground voltage, the drain of the ninth N-type MOS field-effect transistor is coupled to the source of the third N-type MOS field-effect transistor, and the gate of the ninth N-type MOS field-effect transistor is used to receive the reset signal.

7. The dynamic flip-flop as claimed in claim 1, further comprising:

a tenth P-type MOS field-effect transistor connected in series between the power supply voltage and the second P-type MOS field-effect transistor, wherein the source of the tenth P-type MOS field-effect transistor is coupled to the power supply voltage, the drain of the tenth P-type MOS field-effect transistor is coupled to the source of the second P-type MOS field-effect transistor, the gate of the tenth P-type MOS field-effect transistor is used to receive a set signal; and a tenth N-type MOS field-effect transistor coupled between the second node and the seventh node, wherein the source of the tenth N-type MOS field-effect transistor is coupled to the ground voltage, the drain of the tenth N-type MOS field-effect transistor is coupled to a third sub-node between the second node and the seventh node, and the gate of the tenth N-type MOS field-effect transistor is used to receive the set signal.

8. The dynamic flip-flop as claimed in claim 1, further comprising:

an eleventh P-type MOS field-effect transistor connected in series between the power supply voltage and the second P-type MOS field-effect transistor, wherein the source of the eleventh P-type MOS field-effect transistor is coupled to the power supply voltage, the drain of the eleventh P-type MOS field-effect transistor is coupled to the source of the second P-type MOS field-effect transistor, the gate of the eleventh P-type MOS field-effect transistor is used to receive a first control signal;

an eleventh N-type MOS field-effect transistor connected in series between the third N-type MOS field-effect transistor and the ground voltage, wherein the source of the eleventh N-type MOS field-effect transistor is coupled to the ground voltage, the drain of the eleventh N-type MOS field-effect transistor is coupled to the source of the third N-type MOS field-effect transistor, the gate of the eleventh N-type MOS field-effect transistor is used to receive a second control signal that is an inversion of the first control signal;

a twelfth P-type MOS field-effect transistor connected in series between the fifth P-type MOS field-effect transistor and the second node, wherein the source of the twelfth P-type MOS field-effect transistor is coupled to the drain of the fifth P-type MOS field-effect transistor, the drain of the twelfth P-type MOS field-effect transistor is coupled to the second node, the gate of the twelfth P-type MOS field-effect transistor is used to receive the second control signal;

a twelfth N-type MOS field-effect transistor connected in series between the fifth N-type MOS field-effect transistor and the second node, wherein the source of the twelfth N-type MOS field-effect transistor is coupled to the drain of the fifth N-type MOS field-effect transistor, the drain of the twelfth N-type MOS field-effect transistor is coupled to the second node, the gate of the twelfth N-type MOS field-effect transistor is used to receive the first control signal;

a thirteen P-type MOS field-effect transistor, wherein the source of the thirteen P-type MOS field-effect transistor is coupled to a fourth sub-node between the drain of the fifth P-type MOS field-effect transistor and the source of the twelfth P-type MOS field-effect transistor, the drain of the thirteen P-type MOS field-effect transistor is coupled to a fifth sub-node between the second node and the fifth node, the gate of the thirteen P-type MOS field-effect transistor is used to receive the second clock signal; and a thirteen N-type MOS field-effect transistor, wherein the source of the thirteen N-type MOS field-effect transistor is coupled to a sixth sub-node between the drain of the fifth N-type MOS field-effect transistor and the source of the twelfth N-type MOS field-effect transistor, the drain of the thirteen N-type MOS field-effect transistor is coupled to the fifth sub-node, and the gate of the thirteen N-type MOS field-effect transistor is used to receive the first clock signal.

9. An electronic device, comprising:

a dynamic flip-flop, having an input end and an output end, and including:

a transmission gate coupled to the input end and used to receive a first data signal, and output the first data signal to a first node according to a first clock signal and an inverted second clock signal thereof;

a first inverter coupled to the transmission gate via the first node, and used to invert the first data signal and output the inverted first data signal to a second node;

a second inverter coupled between the second node and the output end, and used to invert the inverted first data signal in order to generate a second data signal, and output the second data signal to the output end;

a pull-up transistor coupled between the second node and a power supply voltage, and used to pull up a voltage of the second node to the power supply voltage; and a pull-down transistor coupled between the second node and a ground voltage, and used to pull down the voltage of the second node to the ground voltage;

wherein the transmission gate comprises a first N-type metal-oxide-semiconductor field-effect transistor and a first P-type metal-oxide-semiconductor field-effect transistor connected in parallel with each other, the drain of the first N-type MOS field-effect transistor and the drain of the first P-type MOS field-effect transistor are commonly coupled to the input end of the dynamic flip-flop via a third node, the source of the first N-type MOS field-effect transistor and the source of the first P-type MOS field-effect transistor are commonly coupled to the first node via a fourth node, the gate of the first N-type MOS field-effect transistor is used to receive the first clock signal, and the gate of the first P-type MOS field-effect transistor is used to receive the second clock signal;

wherein the first inverter is a tri-state inverter, and comprises a second P-type MOS field-effect transistor, a third P-type MOS field-effect transistor, a second N-type MOS field-effect transistor and a third N-type MOS field-effect transistor connected in series with each other, the source of the second P-type MOS field-effect transistor is coupled to the power supply voltage, the source of the third N-type MOS field-effect transistor is coupled to the ground voltage, the gate of the second P-type MOS field-effect transistor and the gate of the third N-type MOS field-effect transistor are respectively coupled to the first node for receiving the first data signal, the source of the third P-type MOS field-effect transistor is coupled to the drain of the second P-type MOS field-effect transistor, the source of the second N-type MOS field-effect transistor is coupled to the drain of the third N-type MOS field-effect transistor, the drain of the third P-type MOS field-effect transistor and the drain of the second N-type MOS field-effect transistor are commonly coupled to the second node via a fifth node, the gate of the third P-type MOS field-effect transistor is used to receive the first clock signal, and the gate of the second N-type MOS field-effect transistor is used to receive the second clock signal;

wherein the second inverter comprises a fourth P-type MOS field-effect transistor and a fourth N-type MOS field-effect transistor connected in series with each other, the source of the fourth P-type MOS field-effect transistor is coupled to the power supply voltage, the source of the fourth N-type MOS field-effect transistor is coupled to the ground voltage, the drain of the fourth P-type MOS field-effect transistor and the drain of the fourth N-type MOS field-effect transistor are commonly coupled to the output end of the dynamic flip-flop via a sixth node, and the gate of the fourth P-type MOS field-effect transistor and the gate of the fourth N-type MOS field-effect transistor are commonly coupled to the second node via a seventh node for receiving the inverted first data signal;

wherein the pull-up transistor is a fifth P-type MOS field-effect transistor, the pull-down transistor is a fifth N-type MOS field-effect transistor, the source of the fifth P-type MOS field-effect transistor is coupled to the power supply voltage, the source of the fifth N-type MOS field-effect transistor is coupled to the ground voltage, the drain of the fifth P-type MOS field-effect transistor and the drain of the fifth N-type MOS field-effect transistor are respectively coupled to the second node, and the gate of the fifth P-type MOS field-effect transistor and the gate of the fifth N-type MOS field-effect transistor are respectively coupled to the output end of the dynamic flip-flop for receiving the second data signal;

wherein the pull-up transistor and the pull-down transistor constitute a feedback inverter, and the feedback inverter is configured as a weak keeper circuit compared to the first inverter.

10. The electronic device as claimed in claim 9, wherein the dynamic flip-flop further includes a sixth P-type MOS field-effect transistor and a sixth N-type MOS field-effect transistor connected in series between the fifth P-type MOS field-effect transistor and the fifth N-type MOS field-effect transistor, the source of the sixth P-type MOS field-effect transistor is coupled to the drain of the fifth P-type MOS field-effect transistor, the source of the sixth N-type MOS field-effect transistor is coupled to the drain of the fifth N-type MOS field-effect transistor, the drain of the sixth P-type MOS field-effect transistor and the drain of the sixth N-type MOS field-effect transistor are respectively coupled to the second node, the gate of the sixth P-type MOS field-effect transistor is used to receive the second clock signal, and the gate of the sixth N-type MOS field-effect transistor is used to receive the first clock signal.

11. The electronic device as claimed in claim 9, wherein the dynamic flip-flop further includes a first transistor string and a second transistor string coupled between the input end and the third node.

12. The electronic device as claimed in claim 11, wherein the first transistor string comprises a seventh P-type MOS field-effect transistor and a seventh N-type MOS field-effect transistor connected in series with each other, the source of the seventh P-type MOS field-effect transistor and the source of the seventh N-type MOS field-effect transistor are respectively coupled to the input end for receiving the first data signal, the drain of the seventh P-type MOS field-effect transistor and the drain of the seventh N-type MOS field-effect transistor are commonly coupled to the third node via a first sub-node, the gate of the seventh P-type MOS field-effect transistor is used to receive a first scan enable signal, and the gate of the seventh N-type MOS field-effect transistor is used to receive a second scan enable signal that is an inversion of the first scan enable signal.

13. The electronic device as claimed in claim 12, wherein the second transistor string comprises an eighth P-type MOS field-effect transistor and an eighth N-type MOS field-effect transistor connected in series with each other, the source of the eighth P-type MOS field-effect transistor and the source of the eighth N-type MOS field-effect transistor are respectively coupled to a scanning end for receiving a scan signal, the drain of the eighth P-type MOS field-effect transistor and the drain of the eighth N-type MOS field-effect transistor are commonly coupled to the third node via a second sub-node, the gate of the eighth P-type MOS field-effect transistor is used to receive the second scan enable signal, and the gate of the eighth N-type MOS field-effect transistor is used to receive the first scan enable signal.

14. The electronic device as claimed in claim 9, wherein the dynamic flip-flop further includes:
a ninth P-type MOS field effect transistor coupled between the second node and the seventh node, wherein the source of the ninth P-type MOS field-effect transistor is coupled to the power supply voltage, the drain of the ninth P-type MOS field-effect transistor is coupled to a third sub-node between the second node and the seventh node, the gate of the ninth P-type MOS field-effect transistor is used to receive a reset signal; and
a ninth N-type MOS field-effect transistor connected in series between the third N-type MOS field-effect transistor and the ground voltage, wherein the source of the ninth N-type MOS field-effect transistor is coupled to the ground voltage, the drain of the ninth N-type MOS field-effect transistor is coupled to the source of the third N-type MOS field-effect transistor, and the gate of the ninth N-type MOS field-effect transistor is used to receive the reset signal.

15. The electronic device as claimed in claim 9, wherein the dynamic flip-flop further includes:
a tenth P-type MOS field-effect transistor connected in series between the power supply voltage and the second P-type MOS field-effect transistor, wherein the source of the tenth P-type MOS field-effect transistor is coupled to the power supply voltage, the drain of the tenth P-type MOS field-effect transistor is coupled to the source of the second P-type MOS field-effect transistor, the gate of the tenth P-type MOS field-effect transistor is used to receive a set signal; and a tenth N-type MOS field-effect transistor coupled between the second node and the seventh node, wherein the source of the tenth N-type MOS field-effect transistor is coupled to the ground voltage, the drain of the tenth N-type MOS field-effect transistor is coupled to a third sub-node between the second node and the seventh node, and the gate of the tenth N-type MOS field-effect transistor is used to receive the set signal.

16. The electronic device as claimed in claim 9, wherein the dynamic flip-flop further includes:
   an eleventh P-type MOS field-effect transistor connected in series between the power supply voltage and the second P-type MOS field-effect transistor, wherein the source of the eleventh P-type MOS field-effect transistor is coupled to the power supply voltage, the drain of the eleventh P-type MOS field-effect transistor is coupled to the source of the second P-type MOS field-effect transistor, the gate of the eleventh P-type MOS field-effect transistor is used to receive a first control signal;
   an eleventh N-type MOS field-effect transistor connected in series between the third N-type MOS field-effect transistor and the ground voltage, wherein the source of the eleventh N-type MOS field-effect transistor is coupled to the ground voltage, the drain of the eleventh N-type MOS field-effect transistor is coupled to the source of the third N-type MOS field-effect transistor, the gate of the eleventh N-type MOS field-effect transistor is used to receive a second control signal that is an inversion of the first control signal;
   a twelfth P-type MOS field-effect transistor connected in series between the fifth P-type MOS field-effect transistor and the second node, wherein the source of the twelfth P-type MOS field-effect transistor is coupled to the drain of the fifth P-type MOS field-effect transistor, the drain of the twelfth P-type MOS field-effect transistor is coupled to the second node, the gate of the twelfth P-type MOS field-effect transistor is used to receive the second control signal;
   a twelfth N-type MOS field-effect transistor connected in series between the fifth N-type MOS field-effect transistor and the second node, wherein the source of the twelfth N-type MOS field-effect transistor is coupled to the drain of the fifth N-type MOS field-effect transistor, the drain of the twelfth N-type MOS field-effect transistor is coupled to the second node, the gate of the twelfth N-type MOS field-effect transistor is used to receive the first control signal;
   a thirteen P-type MOS field-effect transistor, wherein the source of the thirteen P-type MOS field-effect transistor is coupled to a fourth sub-node between the drain of the fifth P-type MOS field-effect transistor and the source of the twelfth P-type MOS field-effect transistor, the drain of the thirteen P-type MOS field-effect transistor is coupled to a fifth sub-node between the second node and the fifth node, the gate of the thirteen P-type MOS field-effect transistor is used to receive the second clock signal; and
   a thirteen N-type MOS field-effect transistor, wherein the source of the thirteen N-type MOS field-effect transistor is coupled to a sixth sub-node between the drain of the fifth N-type MOS field-effect transistor and the source of the twelfth N-type MOS field-effect transistor, the drain of the thirteen N-type MOS field-effect transistor is coupled to the fifth sub-node, and the gate of the thirteen N-type MOS field-effect transistor is used to receive the first clock signal.

* * * * *